(12) United States Patent
Goodnow et al.

(10) Patent No.: US 7,307,467 B2
(45) Date of Patent: Dec. 11, 2007

(54) STRUCTURE AND METHOD FOR IMPLEMENTING OXIDE LEAKAGE BASED VOLTAGE DIVIDER NETWORK FOR INTEGRATED CIRCUIT DEVICES

(75) Inventors: Kenneth J. Goodnow, Essex Junction, VT (US); Joseph A. Iadanza, Hinesburg, VT (US); Edward J. Nowak, Essex Junction, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 11/380,799

(22) Filed: Apr. 28, 2006

(65) Prior Publication Data

US 2007/0252641 A1 Nov. 1, 2007

(51) Int. Cl.
*G05F 1/10* (2006.01)
*G05F 3/02* (2006.01)
(52) U.S. Cl. ............ 327/537; 257/347; 438/149; 438/479; 438/517
(58) Field of Classification Search ........... 327/538, 327/540, 541, 543
See application file for complete search history.

(56) References Cited

U.S. PATENT DOCUMENTS

| 6,262,469 | B1 * | 7/2001 | Le et al. .................. 257/532 |
|---|---|---|---|
| 6,518,814 | B1 | 2/2003 | Majid et al. |
| 6,737,912 | B2 | 5/2004 | Otsuka |
| 6,921,982 | B2 * | 7/2005 | Joshi et al. ............... 257/349 |
| 6,989,706 | B2 * | 1/2006 | Sekigawa et al. ......... 327/434 |
| 2003/0178681 | A1 * | 9/2003 | Clark et al. .............. 257/347 |
| 2005/0073354 | A1 | 4/2005 | Abadeer et al. |
| 2007/0013413 | A1 * | 1/2007 | Chiang et al. ............ 326/121 |

OTHER PUBLICATIONS

Pei et al., "Indepedently Driven DG MOSFETs for Mixed-Signal Circuits: Part I—Quasi-Static and Nonquasi-Static Channel Coupling", IEEE Transactions on Electron Devices, vol. 51, No. 12, Dec. 2004, pp. 2086-2093.*
7.4 FinFET—A Quasi-Planar Double-Gate MOSFET; ISSCC 2001 / Session 7 / Technology Directions: Advanced Technologies / 7/4; 2001 IEEE International Solid-State Circuits Conference; 2001.
L. Chang et al.; "Direct-Tunneling Gate Leakage Current in Double-Gate and Ultrathin Body MOFETs;" IEEE Transactions of Electron Devices, vol. 49, No. 12, Dec. 2002; pp. 2288-2295.

* cited by examiner

*Primary Examiner*—Linh My Nguyen
*Assistant Examiner*—Patrick O'Neil
(74) *Attorney, Agent, or Firm*—Cantor Colburn LLP; Michael LeStrange

(57) ABSTRACT

A voltage divider device includes a double gate field effect transistor (FET) having a first gate and a second gate disposed at opposite sides of a body region. An input voltage is coupled between the first and second gates, and an output voltage is taken from at least one of a source of the FET and a drain of the FET, wherein the output voltage represents a divided voltage with respect to the input voltage.

12 Claims, 11 Drawing Sheets

*1500*

STRUCTURE AND METHOD FOR IMPLEMENTING OXIDE LEAKAGE BASED VOLTAGE DIVIDER NETWORK FOR INTEGRATED CIRCUIT DEVICES

BACKGROUND

The present invention relates generally to a voltage divider for an integrated circuit, and, more particularly, to a structure and method for implementing an oxide leakage based voltage divider for integrated circuit devices.

Voltage dividers are often used in integrated circuits to supply a voltage different from that of an available power source. Typically, voltage dividers in integrated circuits are designed using resistors. The most commonly utilized type of resistor in voltage dividers formed on a semiconductor substrate is a P+ poly resistor formed from polysilicon.

The use of resistors in integrated circuit voltage dividers has known drawbacks. For instance, it is often difficult to form resistors having a high resistance when using polysilicon. This is primarily due to the large surface area required in forming polysilicon resistors. As a result, typical resistance values of long, narrow polysilicon resistors are in the range of about 8-10 KΩ. In addition, when using polysilicon, an additional mask and masking steps are used to block the silicide layer that is formed and annealed over the polysilicon (and other layers) for lowering the sheet resistance thereof. Further, polysilicon resistors often have high tolerance for resistance based on geometry and random geometric variations, thus the divide point will vary.

In addition to discrete resistive elements, the use of transistors to divide voltage has also been implemented. However, as with the case for discrete resistor voltage divider networks, a transistor based voltage divider network typically requires the use of at least two or more transistors. Not only is there an added area penalty associated with multiple devices, the operating voltage of a multiple transistor divider needs to be sufficiently high so as to invert at least two transistors. Moreover, where such transistor stacks are connected in a diode configuration to create voltage drop and references, there are related accuracy problems. More specifically, the drop across each source/drain connection is related to the threshold voltage ($V_t$) of the device, which in turn is affected by physical dimensions, process bias, temperature and back bias on the FET. Accordingly, it would be desirable to provide an improved voltage divider source that provides improved high resistance, low current, and temperature independent voltage dividers and reference circuits.

SUMMARY

The foregoing discussed drawbacks and deficiencies of the prior art are overcome or alleviated by a double gate voltage divider device including a field effect transistor (FET) having a first gate and a second gate disposed at opposite sides of a body region. An input voltage is coupled between the first and second gates, and an output voltage is taken from at least one of a source of the FET and a drain of the FET, wherein the output voltage represents a divided voltage with respect to the input voltage.

In another embodiment, a method for implementing an oxide leakage based voltage divider network includes coupling an input voltage between first and second gates of a double gate field effect transistor (FET), the first gate and second gates disposed at opposite sides of a body region, and taking an output voltage from at least one of a source of the FET and a drain of the FET. The output voltage represents a divided voltage with respect to the input voltage.

BRIEF DESCRIPTION OF THE DRAWINGS

Referring to the exemplary drawings wherein like elements are numbered alike in the several Figures.

DETAILED DESCRIPTION

Disclosed herein is a novel, oxide leakage based voltage divider for integrated circuit devices. Briefly stated, an individual double gate FET device is configured into a voltage divider by applying the terminals of a voltage source to first and second gates of the FET and taking a divided output voltage from one of the source and drain terminals (or both if coupled together). In certain embodiments, the source and drain terminals are coupled to one another. In one general embodiment, the source and drain may also be doped with the same polarity type dopant (e.g., N-type) with the body (device channel) being constructed at a sufficiently narrow depth (e.g., less than 5 nm) such that a bias on one gate effectively inverts the entire depth of the channel region. For cases where the body is significantly thicker than this value, the body can be heavily doped with the same polarity dopant as source and drain, or one side of the body can simply remain depleted during operation. Leakage current through the first gate of the device flows to the second gate, bypassing the source/drain regions of the device. This allows the voltage divider to be constructed using lower bias voltages than with respect to multiple device dividers. The divider tap of this new topology is the source, drain, or shorted source/drain region of the FET.

Alternatively, for thicker body thicknesses (and where process capabilities permit), the source and drain regions may be doped with opposite polarity dopants. In this case, leakage current flows from the first gate to one of the source/drain regions, through a short circuit path to (comprising an interconnect between the source/drain terminals) the other of the source/drain regions, and then through the second gate. Either configuration may be applied to various double gate structures, such as vertically disposed front/back gate FETs and finFETs (where the gates and channel are built vertically above the substrate).

Figure 1:
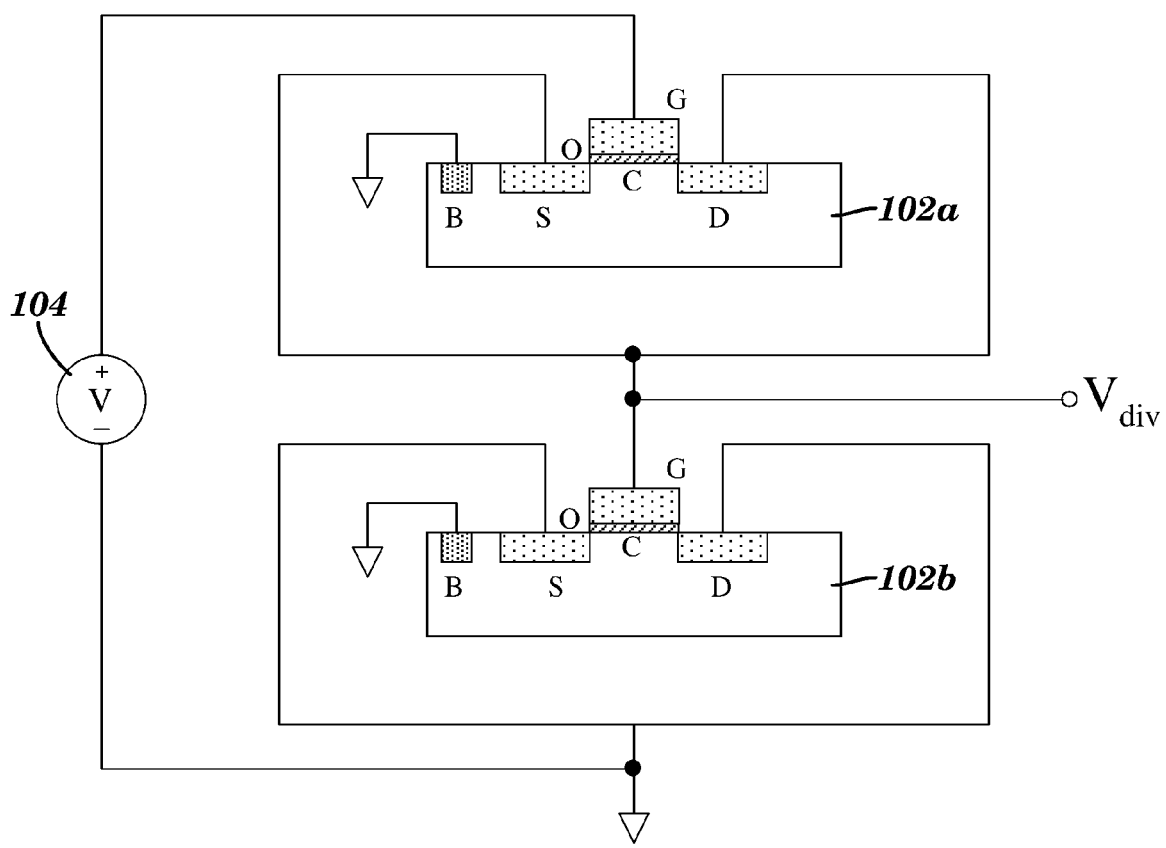
FIG. 1 is a schematic diagram of a previously disclosed, multiple FET voltage divider device.

Referring initially to FIG. 1, there is shown a schematic diagram of previously disclosed, multiple FET voltage divider device 100. As is shown, the device 100 includes at least two FETs, a first FET 102a and a second FET 102b. A voltage source 104 is coupled at one end to the gate (G) of the first FET 102a. The source (S) and drain (D) terminals of FET 102a are shorted together and coupled to the gate of the second FET 102b. The source and drain connections of the second FET 102b are also shorted together and either grounded (as shown in FIG. 1) or, alternatively, brought to the gate of still another FET (not shown) in a larger stack. The bulk or well node (B) of each of the FETs 102a, 102b may either be tied to a constant bias or shorted to the device source/drain. For common applications involving low voltage threshold NFETs, the bulk node is typically grounded, as shown in FIG. 1.

Generally, the bias voltage applied to the resistor divider stack must be sufficient to invert the channels of all FETs included within the stack. A voltage applied at the gate of the first FET 102a inverts the channel of the first FET and generates leakage though the gate oxide (O). Current penetrating the oxide is swept out of the inverted channel (C) to the source/drain regions, thereby supplying bias to the gate of the next FET 102b in the oxide-resistor chain. With sufficient bias to invert all channels, the small leakage current through the oxide emulates a high-value resistor, with voltage division corresponding to a ratio of oxide leakage as determined by stacking, relative oxide thicknesses and relative oxide areas.

Figure 2:
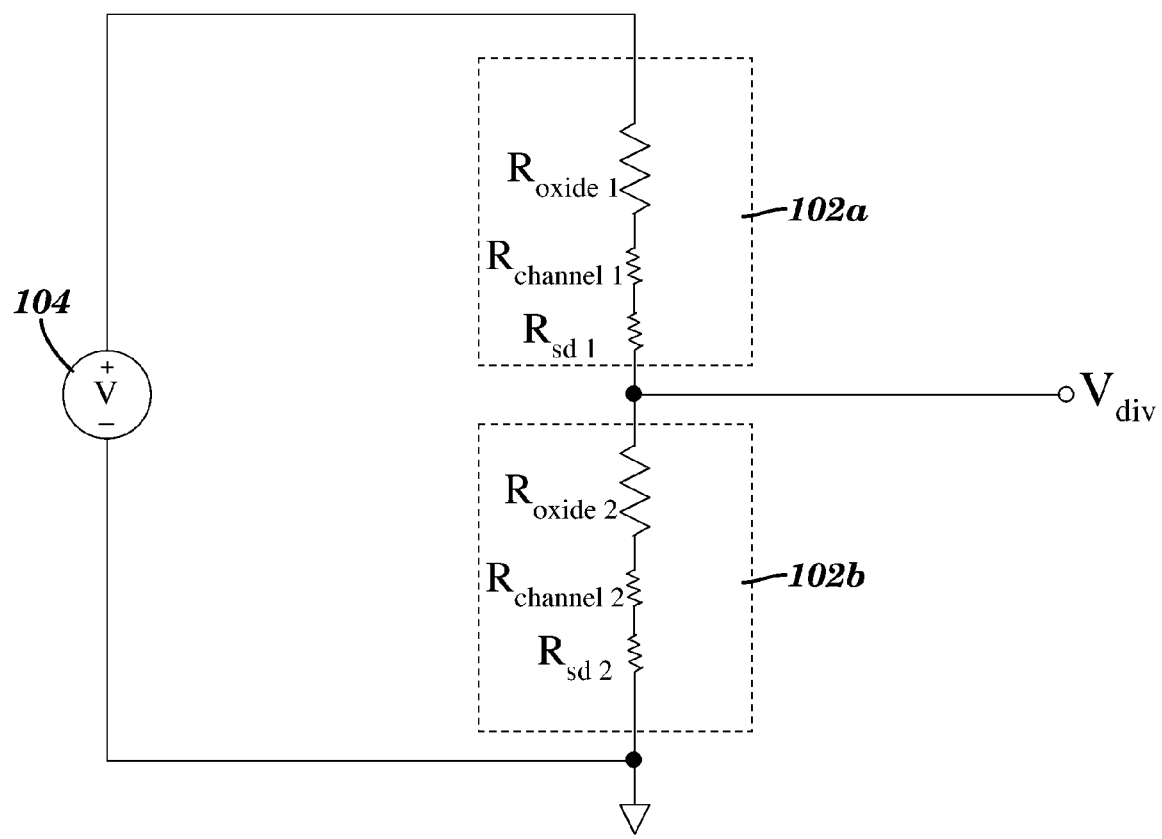
FIG. 2 is an equivalent circuit diagram of the FET voltage divider device shown in FIG. 1.

FIG. 2 is an equivalent circuit diagram of the FET voltage divider device 100 shown in FIG. 1. Each FET 102a, 102b in the network is modeled as a series of three resistances: an oxide resistance ($R_{oxide}$); a channel resistance equivalent ($R_{channel}$) representing the resistance of the inverted channel (2 parallel resistors); and a source/drain resistance equivalent ($R_{sd}$) representing the source/drain resistance (2 parallel resistors). Because $R_{oxide}$ is much larger than $R_{channel}$ or $R_{sd}$, the divider ratio ($V_{div}$) is roughly defined as: $R_{oxide2}/(R_{oxide1}+R_{oxide2})$. As indicated above, at least two FET devices are needed to accomplish the voltage division, and the voltage source 104 must provide a voltage sufficient to invert the channels of each device used in the network.

Figure 3:
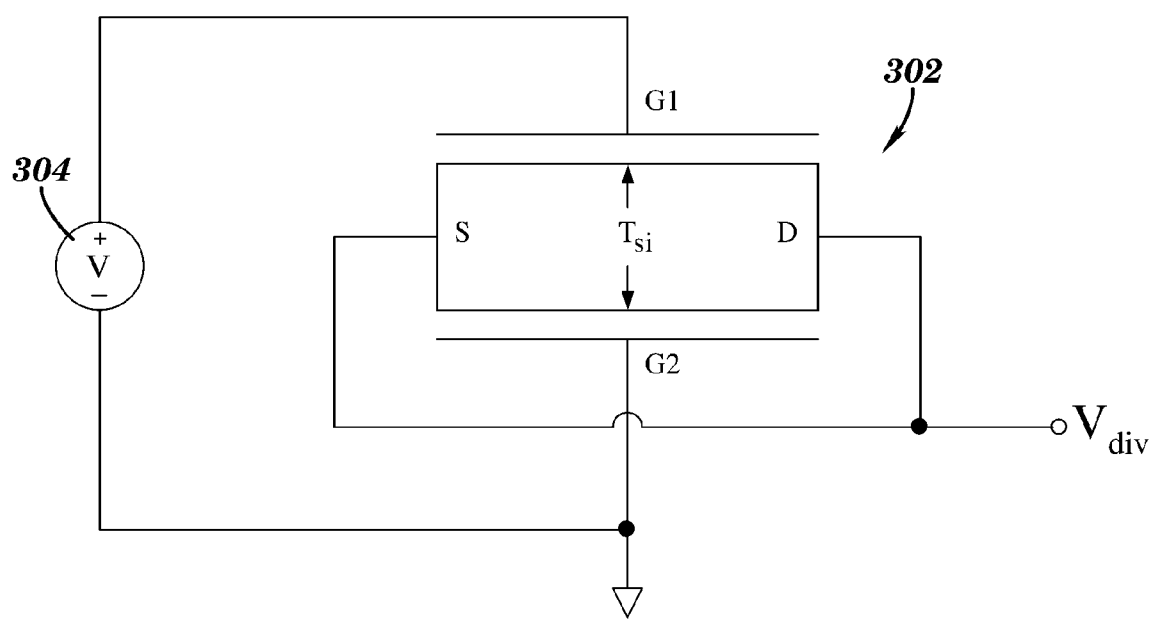
FIG. 3 is a schematic diagram of a double gate FET voltage divider device in accordance with an embodiment of the invention.

FIG. 3 is a schematic diagram of a double gate FET voltage divider device 300 in accordance with an embodiment of the invention. As is shown, a plurality of individual FET devices is replaced with a single, double gate FET device 302, having a first gate (G1) connected to one end of a voltage source 304 and a second gate coupled to the other end of the voltage source 304 (grounded in the depicted embodiment). The source (S) and drain (D) terminals of the double gate device are shorted together, the common node of which defines the divided voltage $V_{div}$.

In the basic structure of a double gate FET, a channel region is sandwiched between two separate oxide regions, which may be of equal or different thicknesses. Gate regions are disposed exterior to the respective oxides and may be of the same or differing work functions. Source and drain regions on opposites of the channel length provide connectivity to the channel. Although the gate lengths and work functions of gates in a double gate device are substantially the same as those of single gate devices, many tailoring parameters exist within a dual gate FET that are not available in a single FET. For instance, the depth ($T_{si}$) of the channel region determines the independence of a channel formed by biasing of the front or rear gate.

For larger $T_{si}$ values, two distinct channels may be formed within the active device region, while a reduction in $T_{si}$ links the effect of the front and back gates. Thus, while configuring a double gate FET of relatively large $T_{si}$ with equal oxide thicknesses and gate types will result in symmetric back and front FETs (i.e., FETs of equal strength), the alteration of the oxide thickness, gate area and/or the gate work function of one of the FETs relative to the other will result in an asymmetric pair of FETs (i.e., FETs of non-equal strength).

Figure 4:
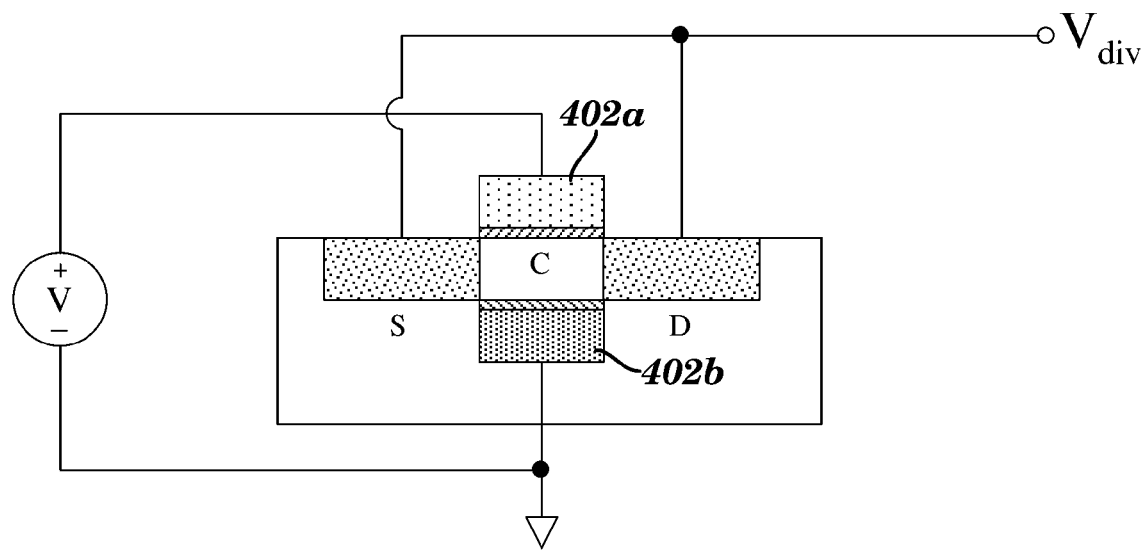
FIG. 4 is a schematic, cross-sectional view of a double gate FET voltage divider device, having a front gate above the device channel and a back gate below the device channel.
Figure 5:
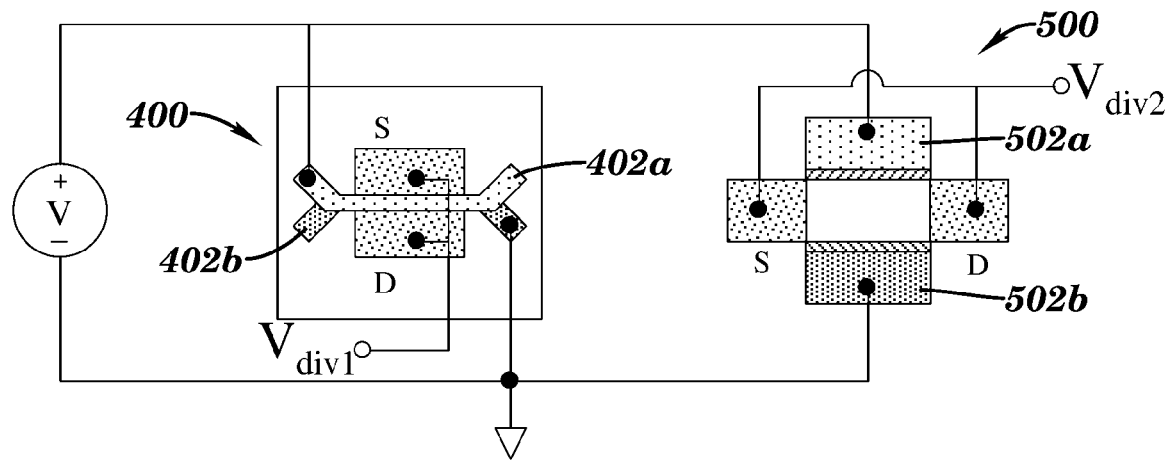
FIG. 5 is a schematic, top view of a first double gate FET voltage divider device having a front gate/back gate configuration and a second double gate FET voltage divider device having a finFET configuration.

FIG. 4 is a schematic, cross-sectional view of a double gate FET voltage divider device 400 (in accordance with the topology generally illustrated in FIG. 3), in which a front gate 402a is formed above the device channel (C) and a back gate 402b is formed below the device channel. In particular, the back gate 402b is laid down in a native substrate 404, after which the source, channel and drain regions are built above the substrate and back gate region. The front gate 402a is then built atop the channel region, thereby forming the double gate device 400. FIG. 5 is a schematic, top-down view that compares the vertically structured double gate device 400 with a finFET embodiment 500. In the finFET embodiment 500 of the double gate voltage divider device, the front and back gates 502a, 502b (as well as the channel) are built vertically above the substrate like a fin.

In either of the embodiments 400, 500 shown in FIG. 5, the double gate FET is constructed with a $T_{si}$ narrow enough (or doped) such that an applied bias voltage on the front gate effectively inverts the entire depth of the channel region. Leakage through the front gate of the device flows "vertically" to the back gate, bypassing the source/drain regions of the device. Current flowing through the channel region then leaks through backside gate oxide under bias. Because the double gate structure requires only a single channel to be inverted to form a basic divider, the new topology can operate at lower bias voltages. Again, the divider tap of the present topology is the shorted source/drain region of the FET.

Figure 6:
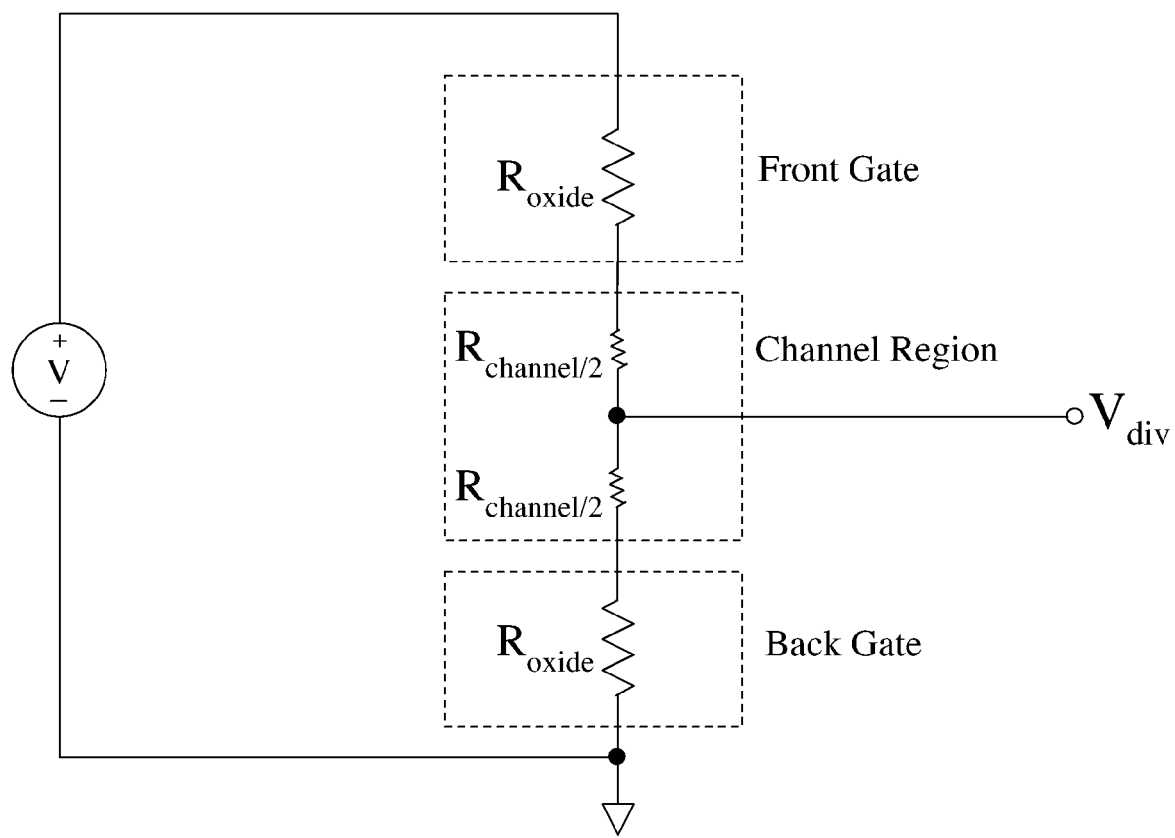
FIG. 6 is an equivalent circuit diagram of the double gate FET voltage divider device shown in FIG. 3.
Figure 7:
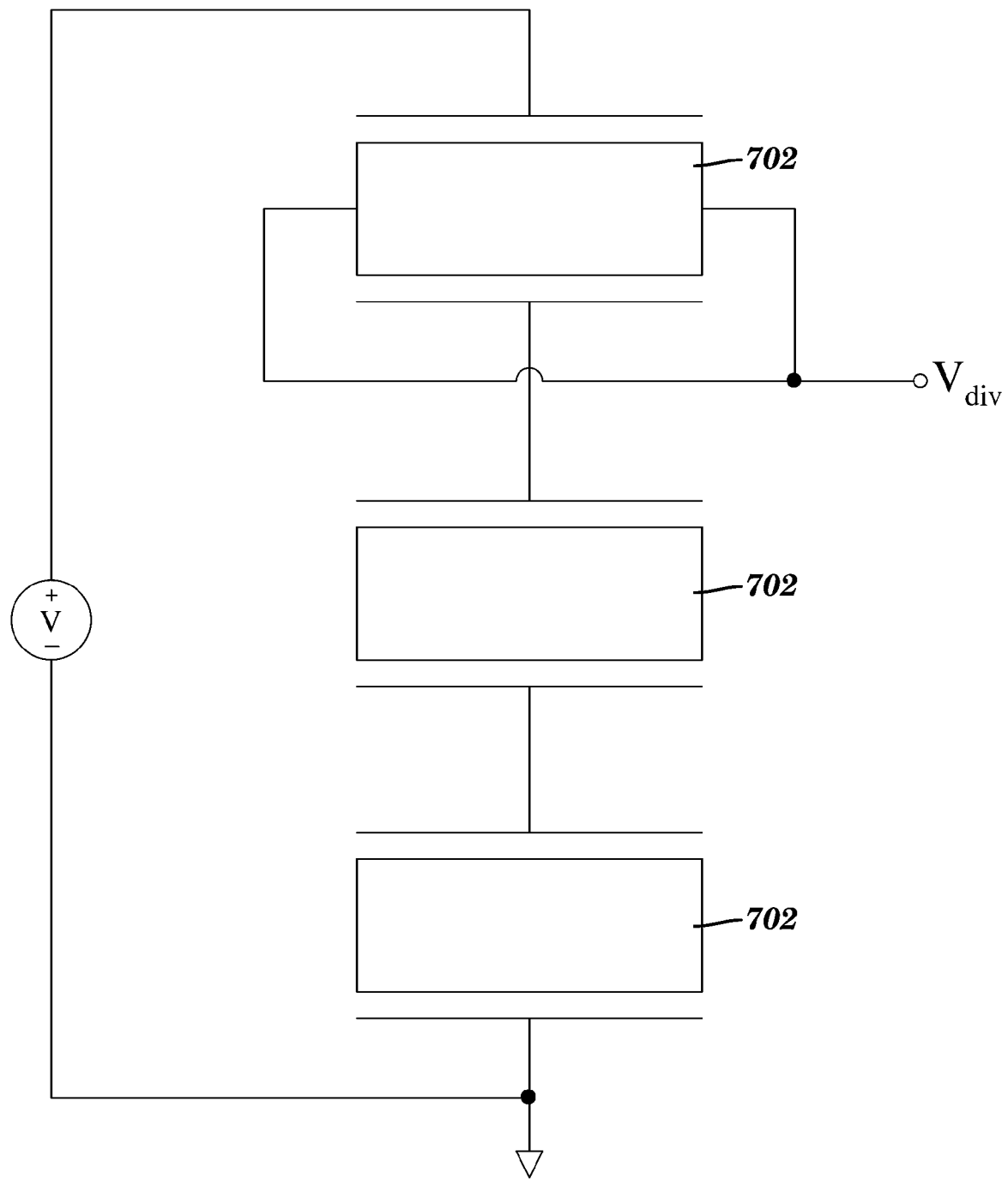
FIG. 7 is a schematic diagram of a double gate FET voltage divider stack in accordance with another embodiment of the invention.

FIG. 6 is an equivalent circuit diagram of the double gate FET voltage divider device shown in FIG. 3. Because the oxide resistance is expected to be much greater than $R_{channel}$, the divider ratio is about: $R_{back\_oxide}/(R_{front\_oxide}+R_{back\_}$ oxide). Although only one double gate device is needed to define a voltage divider, it is contemplated that additional double gate devices 702 may be stacked, as shown in FIG. 7. In addition to providing divided voltage values of desired values, a plurality of tap points may be taken from the (shorted) source/drain terminals of each individual double gate FET.

Figure 8:
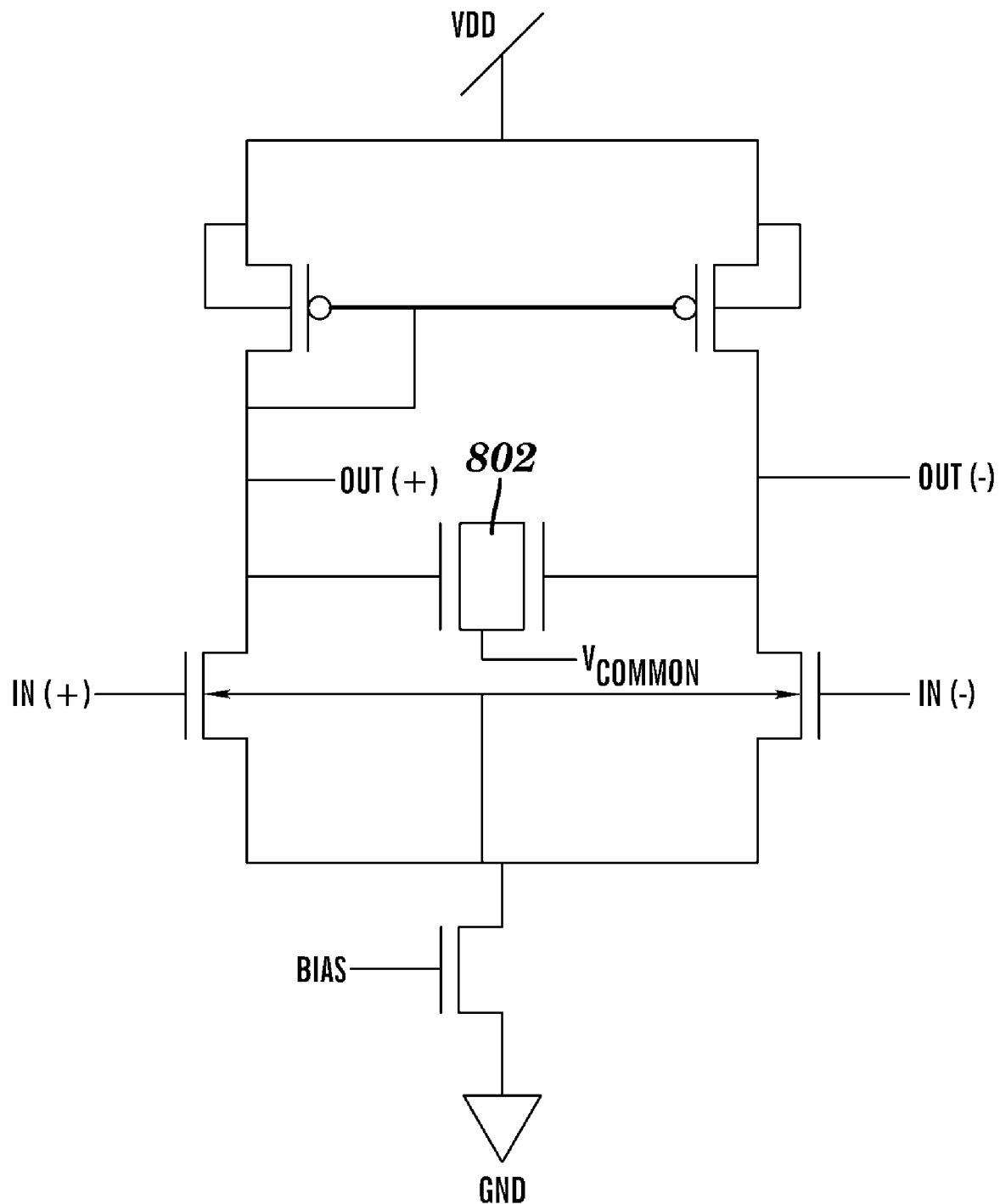
FIG. 8 is a schematic diagram of a differential amplifier utilizing the double gate FET voltage divider for common mode determination.

FIG. 8 illustrates an exemplary application for a single, double gate device configured as a voltage divider. As is shown, a differential amplifier 800 utilizes a double gate FET voltage divider 802 for common mode determination. For differential analog circuits, common mode is typically measured (determined) by disposing two large-value resistors between the positive and negative outputs of the stage. However, large resistors are difficult to form on integrated circuits using conventional resistor devices. As a result, lower resistance values lead to an increased crosscurrent in the stage. In contrast, a double gate FET resistor 802 is instead installed between the positive and negative outputs of the amplifier 800. The shorted source/drain connection of the double gate FET 802 provides the common mode output desired.

Figure 9:
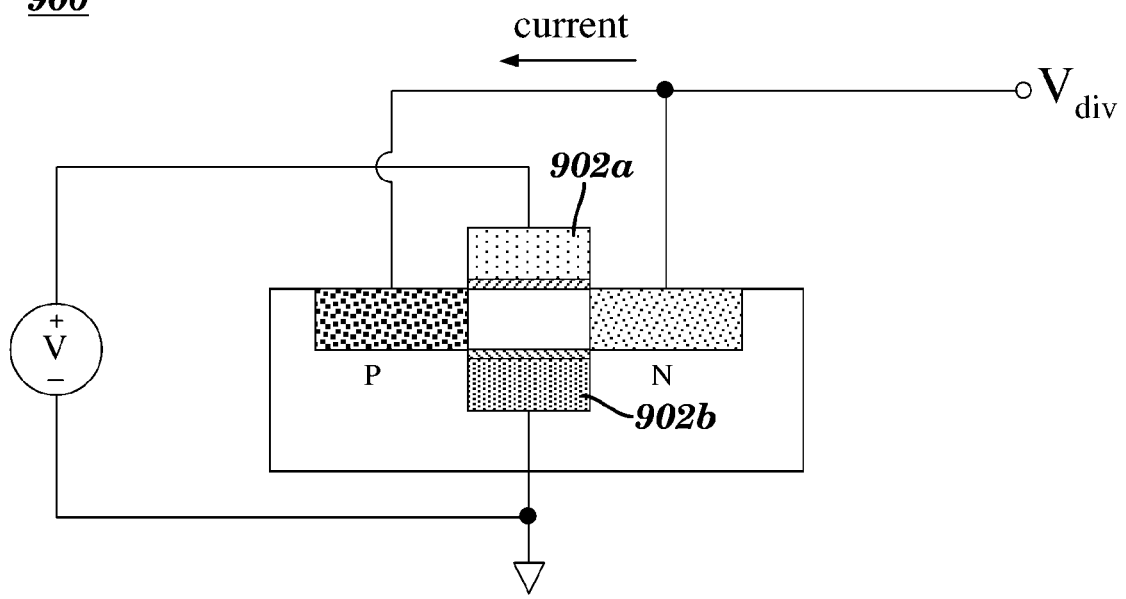
FIG. 9 is alternative embodiment of the double gate FET voltage divider device shown in FIG. 4, wherein the coupled source and drain regions are of opposite polarity types.

To this point, the various double gate voltage divider embodiments discussed have included those devices having a sufficiently shallow body thickness. However, it is also possible to form a double gate divider even where a single inversion area does not occupy the entire body thickness, in which case the disclosed voltage divider will function with an additional voltage drop across the thickness of the body. FIG. 9 illustrates an alternate embodiment of a double gate FET voltage divider 900 in which one of the source and drain diffusions is formed as a P-type diffusion while the other of the source and drain diffusions is formed as an N-type diffusion. In the case of an NFET structure, application of a bias at the front gate 902a will invert the first channel, and gate leakage current will flow from the front gate to the inversion region.

With further increased channel thickness or doping, a p-type channel will be formed at the opposite surface via inversion, otherwise the entire channel thickness will not become depleted. Thus, a reversed-biased diode will occur between the depleted and non-depleted p-type-neutral portions of the channel, such that no current will flow directly to the back gate. Instead, current will be swept out of the inversion area at the source (N-type in this example) and routed, via metal, to the drain region of the device (P-type in this example). Since both the drain and non-inverted portion of the channel are P-type, current will flow to the back gate 902b through the back gate oxide. As will be appreciated, this embodiment is practicable in technologies with the ability to separate the source/drain diffusions from the surrounding bulk.

Figure 10:
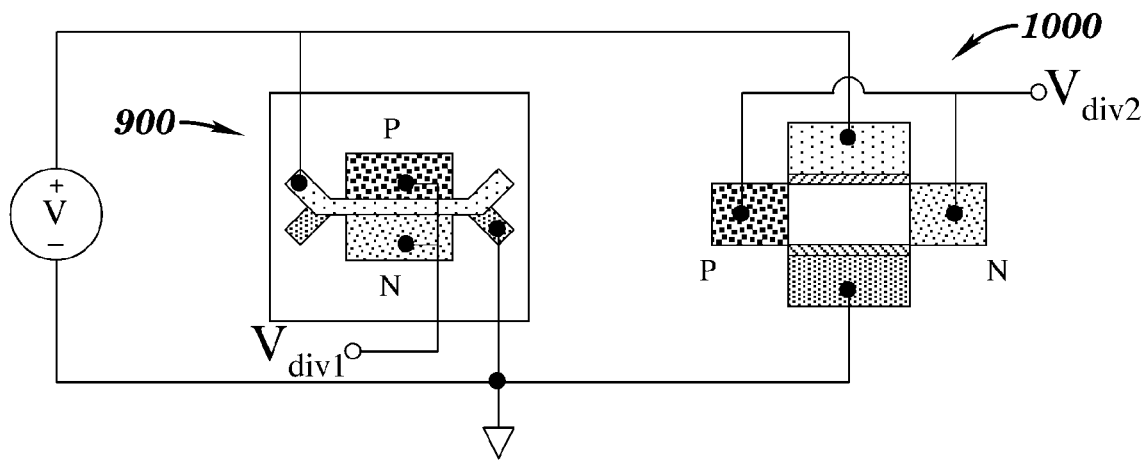
FIG. 10 is a schematic, top view of a first double gate FET voltage divider device having a front gate/back gate configuration and a second double gate FET voltage divider device having a finFET configuration, wherein the coupled source and drain regions are of opposite polarity types.

As is the case with the narrow channel thickness embodiments, the opposite polarity source/drain embodiments can be formed using either the vertically structured gate configuration 900 or the finFET configuration 1000, as illustrated in FIG. 10.

Figure 11:
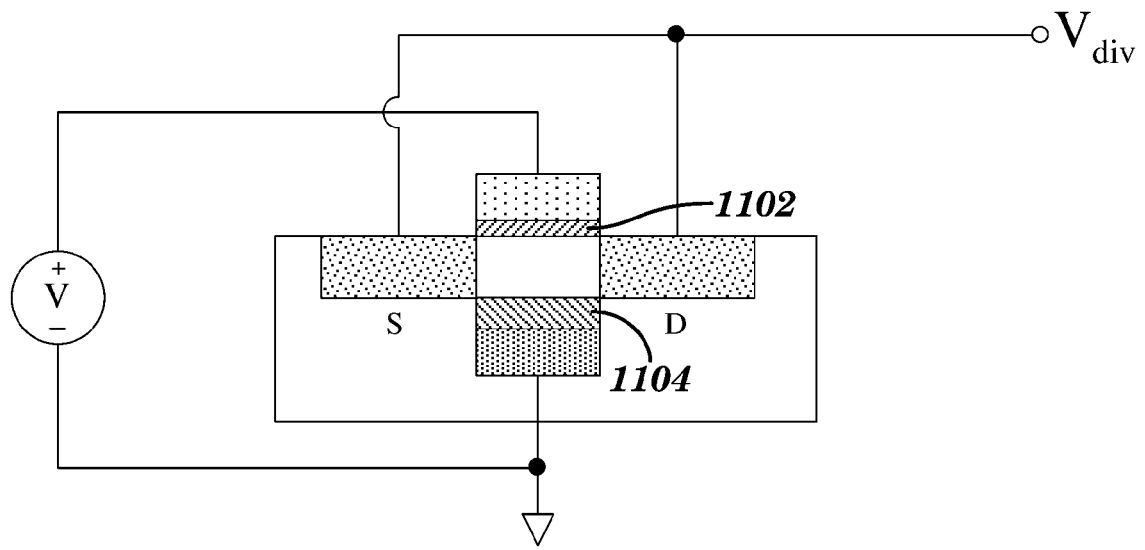
FIG. 11 is a schematic, cross-sectional view of a double gate FET voltage divider device, having gate oxide layers of unequal thicknesses, in accordance with a further embodiment of the invention.

Referring now to FIG. 11, there is shown a schematic, cross-sectional view of a double gate FET voltage divider device 1100, in accordance with still a further embodiment of the invention. As discussed above, the variation of one or more device parameters can result in an asymmetrical voltage divider (i.e., one in which the divided voltage is not half the input voltage). In this embodiment, the front gate oxide 1102 is thinner than the back gate oxide 1104. As such, the lower portion of the device 1100 has a higher resistance and thus $V_{div}$ will be greater than half the value the input voltage.

Conversely, if the front gate oxide were to be formed thicker than the back gate oxide 1104, then $V_{div}$ would be less than half the value of the input voltage.

Figure 12:
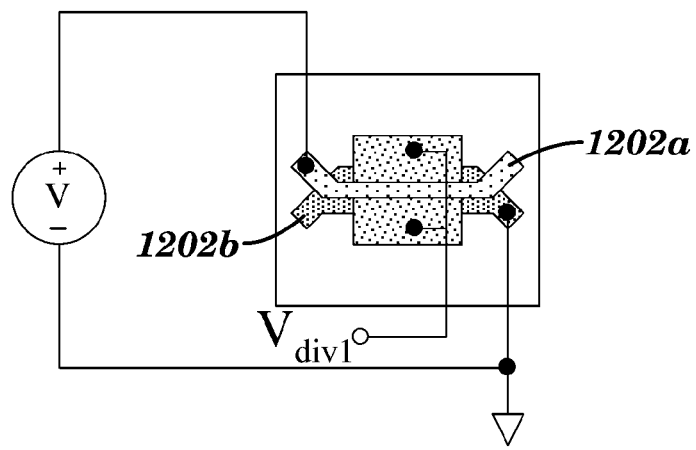
FIG. 12 is a schematic, top view of an alternative embodiment of a double gate FET voltage divider device, wherein the areas of the front and back gates are unequal, in accordance with a further embodiment of the invention.

FIG. 12 is a top view of still another alternative embodiment of a double gate FET voltage divider device 1200, wherein the areas of the front and back gates are unequal. In this particular embodiment, the area of the front gate 1202a is less than that of the back gate 1202b. As a result, the lower portion of the device 1200 has a lower resistance and thus $V_{div}$ will be less than half the value the input voltage. Conversely, if the front gate 1202a area were to be larger than the back gate 1202b area, then $V_{div}$ would be greater than half the value of the input voltage. It will also be appreciated that a double gate voltage device could also incorporate both asymmetrical gate areas and oxide thickness to produce a desired voltage divide ratio.

Figure 13:
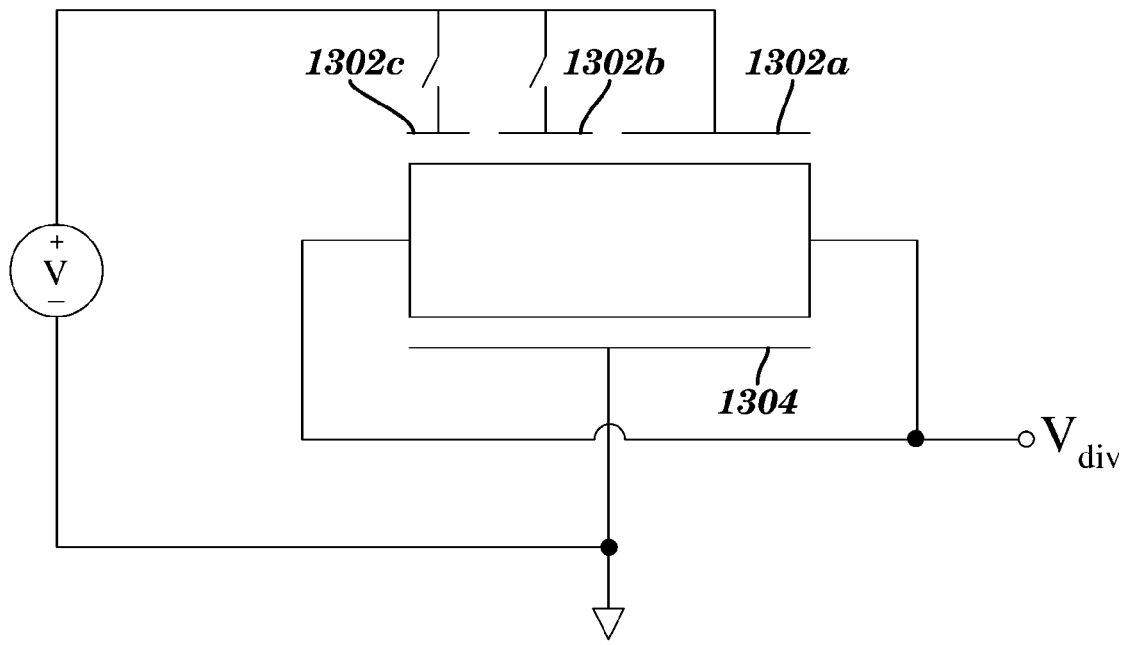
FIG. 13 is a schematic diagram of a double gate FET voltage divider device in accordance with still another embodiment of the invention, wherein one of the gates is selectively tunable to provide increased or decreased area.
Figure 14:
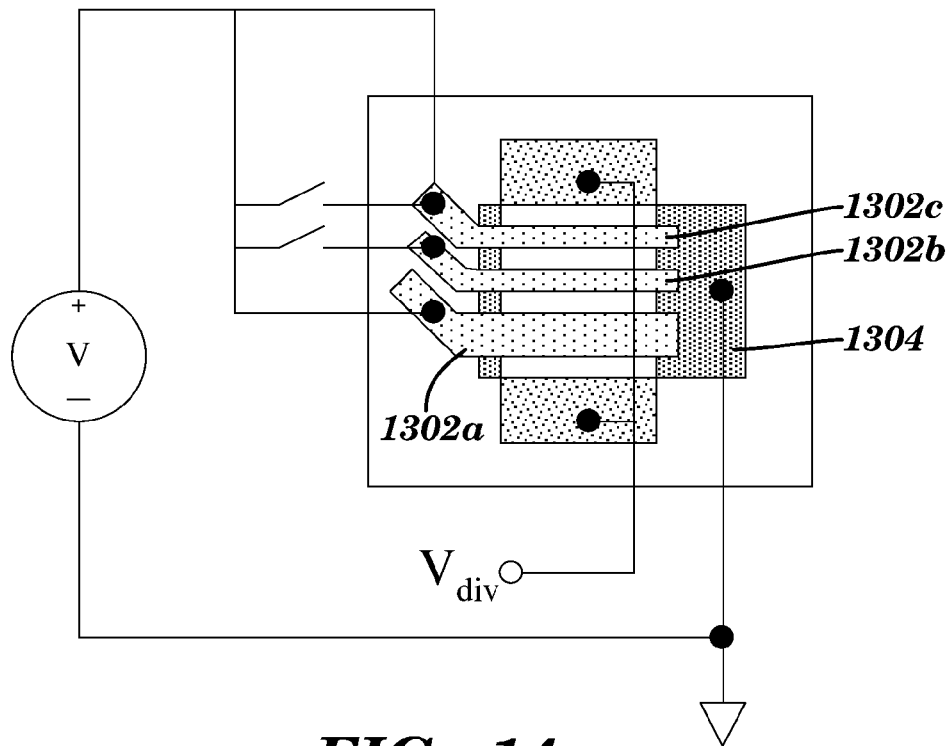
FIG. 14 is a schematic, top view of the double gate FET voltage divider device shown in FIG. 13.

FIGS. 13 and 14 illustrate still a further embodiment of a double gate voltage device 1300, wherein a plurality of discrete front gates 1302a, 1302b, 1302c (e.g., of varying sizes) are disposed over a single, larger back gate 1304. In this embodiment, the total resistance of the device may therefore be selectively tuned by switching between greater and lesser amounts of front gate area. In addition, where the divider output is located in a manner accessible to the resistor channel in each circumstance, the device 1300 could also be configured to implement a "select one-of-N resistances" functionality.

Figure 15:
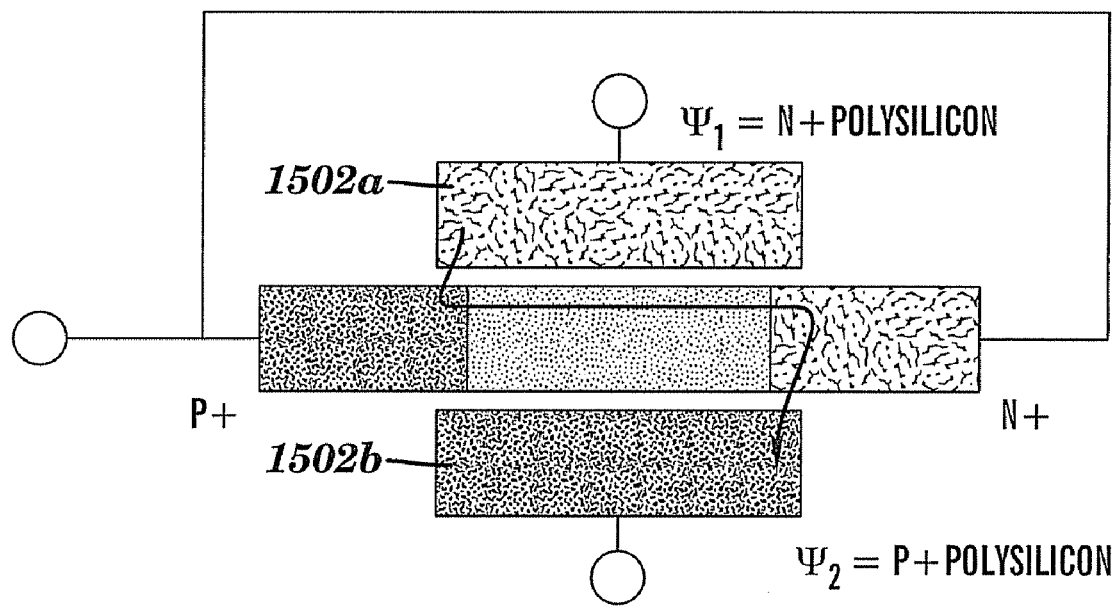
FIG. 15 is a schematic, cross-sectional view of the double gate FET voltage divider device in accordance with still another embodiment of the invention, wherein the source/drain regions are of opposite polarity types, and the front/back gates are of opposite polarity types.

Finally, FIG. 15 is a schematic, cross-sectional view of a double gate FET voltage divider device 1500 in accordance with still another embodiment of the invention, wherein the source/drain regions are of opposite polarity types, and wherein the front and back gates 1502a, 1502b are of opposite polarity types. In this embodiment, both n-type and p-type sources of carriers are provided for the double-gate divider 1500. The two gates can be of the same work function or of differing work functions. Generally, the work functions $\Psi 1$, $\Psi 2$, the body thickness ($T_{si}$) and the doping of the body may be chosen so that when the front and back gates are at their respective operating voltages there is a voltage drop across the body equal to the band-gap voltage. (e.g., 1.1 volts for silicon). As indicated above, leakage current (e.g., as indicated by the arrow) flows from the first gate 1502a to one of the source/drain regions (e.g., P+), through a short circuit path to the other of the source/drain regions (e.g., N+), and then through the second gate 1502b. (e.g., 1.1 volts for silicon).

As will thus be appreciated, the double gate voltage divider topology represents an improvement over existing divider networks. In one respect, the operating voltage of a single, double gate divider may be lower with respect to multiple, single gate FETs. The double gate topology also eliminates source/drain current, and provides isolation from the substrate in that the channel inversion voltage is immune to substrate bias.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A voltage divider device, comprising:
   a double gate field effect transistor (FET) having a first gate and a second gate disposed at opposite sides of a body region;
   an input voltage coupled between said first and second gates; and
   an output voltage taken from at least one of a source of said FET and a drain of said FET, with said source and drain having opposite polarity types and coupled to one another;
   wherein said output voltage represents a divided voltage with respect to said input voltage.

2. The device of claim 1, wherein said FET is a planar, double gate device with said source and drain formed above said second gate, and said first gate formed above source and drain.

3. The device of claim 1, wherein said FET comprises a double gate finFET.

4. The device of claim 3, wherein said first and second gates are of opposite polarity types.

5. The device of claim 1, wherein a leakage current path through said FET is defined from said first gate, through a first gate oxide to one of said source and drain, through a common conductive path therebetween, to the other of said source and drain, through a second gate oxide and to said second gate.

6. The device of claim 1, wherein at least one of said first and second gates have selectively variable areas.

7. A voltage divider device, comprising:
   a double gate field effect transistor (FET) having a first gate and a second gate disposed at opposite sides of a body region;
   an input voltage coupled across said first and second gates;
   an output voltage taken from at least one of a source of said FET and a drain of said FET;
   wherein said output voltage represents a divided voltage with respect to said input voltage; and
   a plurality of double gate FETs configured in a stack arrangement, with a first terminal of an input voltage source coupled to a first gate of a first double gate FET, a second gate of said first double gate FET coupled to a first gate of a second double gate FET, and a second gate of a final double gate FET coupled to a second terminal of said input voltage source.

8. A voltage divider device, comprising:
   a double gate field effect transistor (FET) having a first gate and a second gate disposed at opposite sides of a body region;
   an input voltage coupled across said first and second gates; and
   an output voltage taken from at least one of a source of said FET and a drain of said FET;
   wherein said output voltage represents a divided voltage with respect to said input voltage; and
   wherein said input voltage comprises output terminals of a differential amplifier, and said divided output voltage represents the common mode voltage of said differential amplifier.

9. A method for implementing an oxide leakage based voltage divider network, the method comprising:
   coupling an input voltage across first and second gates of a double gate field effect transistor (FET), said first gate and second gates disposed at opposite sides of a body region; and
   taking an output voltage from at least one of a source of said FET and a drain of said FET;
   wherein said output voltage represents a divided voltage with respect to said input voltage;
   wherein said source and drain are of opposite polarity types; and
   a leakage current path through said FET is defined from said first gate, through a first gate oxide to one of said source and drain, through a common conductive path therebetween, to the other of said source and drain, through a second gate oxide and to said second gate.

10. The method of claim 9, wherein said FET is a planar, double gate device with said source and drain formed above said second gate, and said first gate formed above said source and drain.

11. The method of claim 9, wherein said FET comprises a double gate finFET.

12. The method of claim 9, wherein said first and second gates are of opposite polarity types.

* * * * *